United States Patent [19]
Bergemont et al.

[11] Patent Number: 5,978,269
[45] Date of Patent: Nov. 2, 1999

[54] APPARATUS AND METHOD FOR LOWERING THE POTENTIAL BARRIER ACROSS THE SOURCE-TO-WELL JUNCTION DURING THE PROGRAMMING OF NON-VOLATILE MEMORY CELLS

[75] Inventors: Albert Bergemont, Palo Alto; Alexander Kalnitsky, San Francisco; Pavel Poplevine, Foster City, all of Calif.

[73] Assignee: National Semiconductor Corporation, Santa Clara, Calif.

[21] Appl. No.: 09/135,125

[22] Filed: Aug. 17, 1998

[51] Int. Cl.$^6$ .................................................. G11C 16/00
[52] U.S. Cl. .............................. 365/185.19; 365/185.03; 365/185.23; 365/185.28
[58] Field of Search .................... 365/185.28, 185.19, 365/185.23, 185.27, 185.03, 185.18

[56] References Cited

U.S. PATENT DOCUMENTS

| | | | |
|---|---|---|---|
| 5,042,009 | 8/1991 | Kazerounian et al. | 365/185.18 |
| 5,483,486 | 1/1996 | Javanifard et al. | 365/185.23 |
| 5,511,021 | 4/1996 | Bergemont et al. | 365/185.03 |
| 5,515,319 | 5/1996 | Smayling et al. | 365/185.18 |
| 5,600,592 | 2/1997 | Atsumi et al. | 365/185.23 |
| 5,677,874 | 10/1997 | Yamano | 365/185.18 |

OTHER PUBLICATIONS

Kalnitsky, A., et al., "Experimental Investigation of N–MOS Inversion Layers in the Electric Quantum Limit," *Journal of Electronic Materials*, vol. 21, No. 3, pp. 367–372, 1992.

*Primary Examiner*—Tan T. Nguyen
*Attorney, Agent, or Firm*—Limbach & Limbach L.L.P.

[57] ABSTRACT

An EPROM or flash memory cell is programmed to store two or more bits of information by applying one of a plurality of programming voltages to the control gate of the memory cell, and by injecting electrons from the source region into the well or substrate. Electrons are injected from the source region into the well or substrate by utilizing charge pumps to cause a series of current pulses to flow from the well of the memory cell through the source region to the pump. These electrons are then available to participate in the formation of well or substrate hot electrons.

12 Claims, 2 Drawing Sheets

APPARATUS AND METHOD FOR LOWERING THE POTENTIAL BARRIER ACROSS THE SOURCE-TO-WELL JUNCTION DURING THE PROGRAMMING OF NON-VOLATILE MEMORY CELLS

BACKGROUND OF THE INVENTION

1. Field of the Invention

The present invention relates to an apparatus and method for programming non-volatile memory cells and, more particularly, to an apparatus and method for lowering the potential barrier across the source-to-well junction during the programming of non-volatile memory cells.

2. Description of the Related Art

A non-volatile memory cell is a semiconductor device that stores information even after power has been removed from the device. Two of the most common types of non-volatile memory cells are electrically-programmable read-only-memory (EPROM) cells and flash memory cells.

FIG. 1 shows a cross-sectional diagram that illustrates a conventional EPROM or flash memory cell 10. As shown in FIG. 1, cell 10 includes spaced-apart n+ source and drain regions 12 and 14 which are formed in a p-type semiconductor material 16 such as a well or a substrate.

In addition, cell 10 also includes a channel region 18 which is defined between source and drain regions 12 and 14, a layer of gate oxide 20 which is formed over channel region 18, and a floating gate 22 which is formed over gate oxide layer 20. Further, cell 10 additionally includes a layer of interpoly dielectric 24 which is formed over gate 22, and a control gate 26 which is formed over dielectric layer 24.

EPROM and flash memory cells are commonly programmed to store one bit of information as either a logic zero or a logic one. More recently, however, programming techniques have been developed which allow EPROM and flash memory cells to store two or more bits of information.

The advantages of programming a single cell to store two or more bits of information are obvious. If each memory cell, for example, can be programmed to store two bits of information as either a "00", "01", "10", or "11", then the density of an array can be doubled without changing the physical size of the array.

One of these multi-bit programming approaches, as disclosed in U.S. Pat. No. 5,511,021 to Bergemont et al., teaches that a single EPROM or flash memory cell can be programmed to store a plurality of logic levels by utilizing a corresponding plurality of control gate voltages, and by forward biasing the source-to-well junction.

EPROM and flash memory cells are conventionally programmed by applying a programming voltage to control gate 26 and a drain voltage to drain region 14, while source region 12 and well 16 are grounded. When the programming voltage is applied to control gate 26, a positive potential is induced on floating gate 24.

The positive potential on floating gate 24, in turn, attracts electrons to the surface of channel region 20 to form a channel 30, and also repels holes to form a depletion region 32. When the drain voltage is applied to drain region 14, an electric field is established between the source and drain regions 12 and 14 in channel region 30 and depletion region 32.

The electric field accelerates the electrons in channel 30 which forms "channel hot electrons". The positive potential of floating gate 24 attracts these channel hot electrons which penetrate gate oxide layer 22 and begin accumulating on floating gate 24, thereby raising the threshold voltage of the cell.

As taught by Bergemont, given a sufficient amount of time, the threshold voltage of a cell being programmed will converge to a stable value which is defined by the programming voltage applied to control gate 26. In addition, the threshold voltages are linearly related to the programming voltages. Thus, for example, programming voltages of zero, one, two, and three volts will produce threshold voltages of approximately two, three, four, and five volts, respectively. (See FIG. 7 of Bergemont).

To reduce the amount of time required to achieve these stable threshold voltages, the source-to-well junction is forward-biased by placing a negative voltage on source region 12. By forward biasing the source-to-well junction, increased numbers of electrons are injected into depletion region 32 of well 16. These electrons are also accelerated by the electric field which, in turn, causes the formation of well or substrate hot electrons. A portion of the substrate hot electrons are then injected onto floating gate 22.

Negative voltages are commonly placed on circuit nodes, such as source region 12, via external sources or on-board charge pumps. External sources, however, are typically not a favored approach as this requires the use of a pin on the external package to input the external voltage.

Thus, although both external sources and on-board charge pumps may be used to provide the negative voltage required to forward bias the junction, it is desirable to have other approaches for injecting electrons into the well.

SUMMARY OF THE INVENTION

One technique for programming a non-volatile memory cell to store two or more bits of information requires that electrons from the source region be injected into the depletion region of the well (or substrate). With a grounded well, this may be accomplished by applying a negative voltage to the source region to forward bias the source-to-well junction. Two common ways of obtaining the negative voltage are to use an external supply, which has the disadvantage of requiring a package pin to input the external voltage, and an on-board charge pump.

Rather than applying a voltage to the source region to forward bias the source-to-well junction, the present invention provides another approach that utilizes an on-board charge pump to cause a series of current pulses to flow from the well of the memory cell through the source region to the pump which, in turn, causes electrons to be injected into the depletion region of the well.

The memory circuit of the present invention includes a first region of semiconductor material that has a first conductivity type, and a second region of semiconductor material that has a second conductivity type.

The memory circuit also includes a memory cell which has spaced-apart source and drain regions of the second conductivity type which are formed in the first region of semiconductor material, and a channel region which is defined between the source and drain regions.

In addition, the memory cell also includes a layer of first insulation material that is formed over the channel region, and a floating gate that is formed over the layer of first insulation material. Further, a layer of second insulation material is formed over the floating gate, and a control gate is formed over the layer of second insulation material.

The memory circuit of the present invention additionally includes a charge pump that has a first diffusion region of the first conductivity type which is formed in the second region of semiconductor material, a layer of third insulation material which is formed over the second region of semiconductor material and a portion of the first diffusion region, and a charge pump gate which is formed on the layer of third insulation material. In the present invention, the first diffusion region is electrically connected to the source region.

The memory circuit of the present invention also includes a control circuit which connected to the control gate, the drain region, and the charge pump gate.

In operation, the memory cell is programmed to store two or more bits of information by identifying a threshold voltage from three or more threshold voltages which are to be set in the memory cell, and selecting a programming voltage that corresponds to the threshold voltage. In the present invention, each of the three or more threshold voltages has a corresponding programming voltage.

In addition, a first voltage is applied to the first region of substrate material, while a second voltage is applied to the drain region so that a drain-to-first region junction is reverse-biased. Further, the selected programming voltage is applied to the control gate, and a plurality of pulses are applied to the charge pump gate.

A better understanding of the features and advantages of the present invention will be obtained by reference to the following detailed description and accompanying drawings which set forth an illustrative embodiment in which the principals of the invention are utilized.

DETAILED DESCRIPTION

Figure 2:
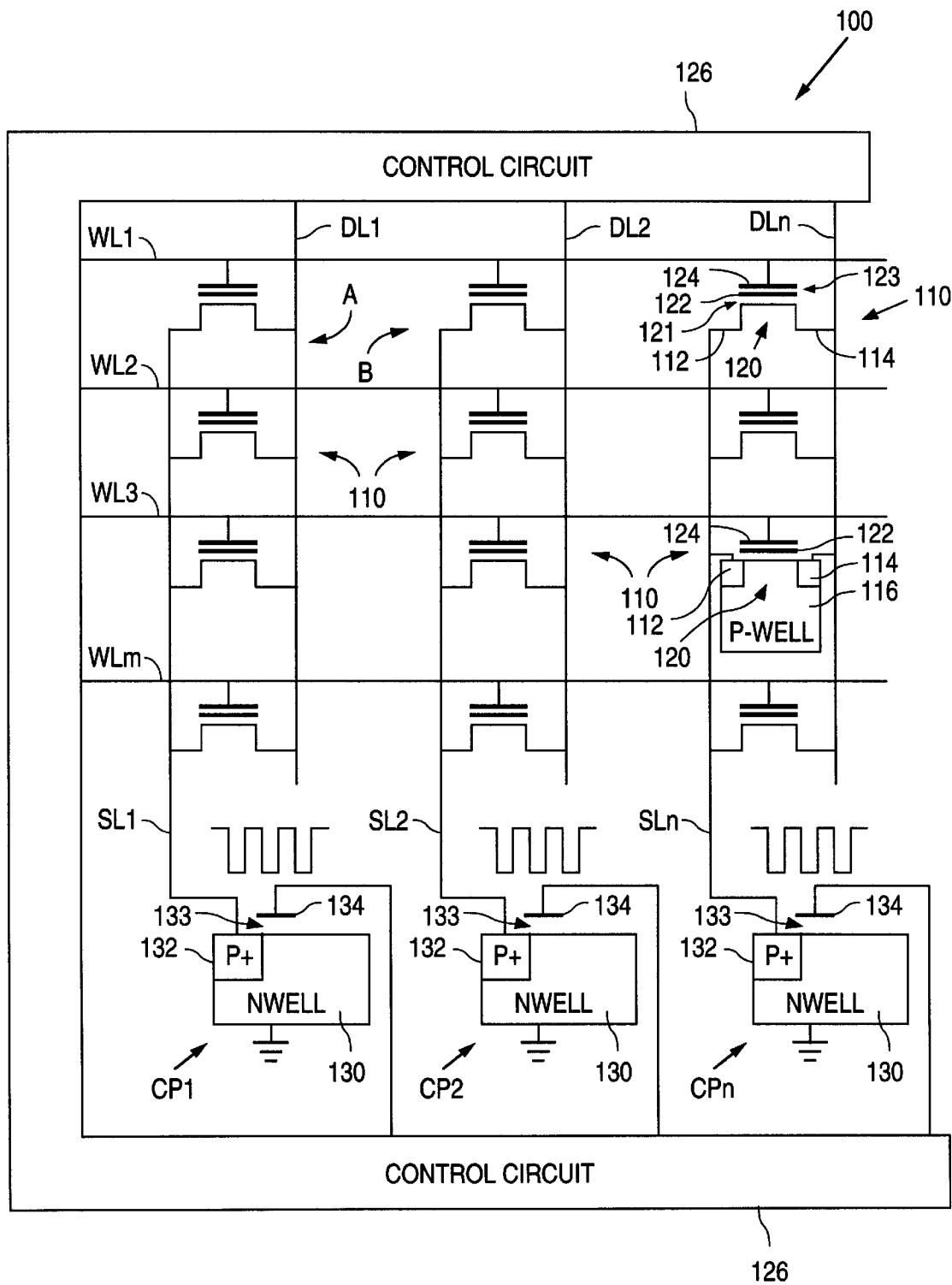
FIG. 2 is a schematic diagram illustrating a memory circuit 100 in accordance with the present invention.

FIG. 2 shows a schematic diagram that illustrates a memory circuit 100 in accordance with the present invention. As described in greater a detail below, rather than applying a voltage to the source region to forward bias the source-to-well junction, circuit 100 utilizes charge pumps to cause a series of current pulses to flow from the well of the memory cell through the source region to the pump which, in turn, causes electrons to be injected into the well. These electrons are then available to participate in the formation of well or substrate hot electrons.

As shown in FIG. 2, circuit 100 includes a plurality of EPROM or flash memory cells 110 which are formed in rows and columns in a p-type semiconductor material 116, such as a well or substrate. Each memory cell 110, in turn, includes spaced-apart n+ source and drain regions 112 and 114, respectively, which are formed in well 116.

Each memory cell 110 also includes a channel region 120 which is defined between source and drain regions 112 and 114, a layer of first insulation material 121 which is formed over channel region 120, and a floating gate 122 which is formed over layer 121. Each cell 110 further includes a layer of second insulation material 123 which is formed over floating gate 122, and a control gate 124 which is formed over layer 123.

As further shown in FIG. 2, circuit 100 additionally includes a plurality of word lines WL1-WLm which are connected to the memory cells 110 such that each word line WL is connected to all of the control gates 124 in a row of cells 110.

Circuit 100 also includes a plurality of source lines SL1-SLn which are connected to the memory cells 110 such that each source line SL is connected to all of the source regions 112 in a column of cells 110. In addition, a plurality of drain lines DL1-DLn are connected to the memory cells 110 such that each drain line DL is connected to all of the drain regions 114 in a column of cells 110.

As further shown in FIG. 2, circuit 100 additionally includes a control circuit 126 which is connected to the word lines WL1-WLm, the drain lines DL1-DLn, and the gates 134 of the charge pumps CP1-CPn.

Circuit 100 also includes a plurality of charge pumps CP1-CPn which are formed in a n-type material 130, such as a well or substrate. The charge pumps CP1-CPn are connected to the memory cells 110 via the source lines SL1-SLn such that each charge pump CP is connected to a source line SL. Each charge pump CP, in turn, includes a p+ diffusion region 132 which is formed in n-well 130, a layer of third insulation material 133 which is formed over n-well 130, and a gate 134 which is formed over insulation layer 133 over n-well 130 and a portion of p+ diffusion region 132.

To program the memory cells, control circuit 126 identifies a row of cells to be programmed and, from within the selected row of cells, the one or more cells that are to be programmed. Control circuit 126 also identifies a threshold voltage from three or more threshold voltages which is to be set in the one or more selected cells, and selects a programming voltage that corresponds to the selected threshold voltage. The programming voltage is then applied to the word line WL that is connected to the selected row, while ground is applied to the remaining word lines WL.

As described in U.S. Pat. No. 5,511,021 to Bergemont et al., which is hereby incorporated by reference, the programming voltage is one of a plurality of programming voltages which may be applied to the word line WL (control gates 124), and corresponds with the threshold voltage that is to be set in the to-be-programmed cells.

In addition, a drain voltage, such as VCC, is applied to each drain line DL that is connected to a to-be-programmed cell, while ground is applied to the remaining drain lines DL. Further, in accordance with the present invention, a series of negative pulses are applied to the gates 134 of the charge pumps CP1-CPn that are connected to the to-be-programmed cells, while ground is applied to the remaining gates 134. Since the negative pulses are applied to the gates 134, the negative pulses may be generated by on-board charge pumps as the charge pumps do not need to sustain a large current flow.

Thus, for example, if cell A of FIG. 2 is to be programmed to have a threshold voltage of approximately three volts, then a programming voltage of approximately one volt is applied to word line WL1, while ground is applied to word lines WL2-WLm. (See FIG. 7 of Bergemont et al.).

In addition, a drain voltage of approximately five volts is applied to drain line DL1, while ground is applied to drain lines DL2-DLn. Further, a series of negative pulses are applied to gate 134 of charge pump CP1, while ground is applied to the gates 134 of charge pumps CP2-CPn.

(Alternately, the series of negative pulses can be applied to all of the gates 134 of charge pumps CP1-CPn when any cell is being programmed as the non-selected cells are inhibited from being programmed since ground is applied to the word line WL, the drain line DL, or both of the non-selected cells.)

Similarly, if cells A and B of FIG. 2 are to be programmed to have a threshold voltage of approximately four volts, then a programming voltage of approximately two volts is applied to word line WL1, while ground is applied to word lines WL2-WLm.

In this case, a drain voltage of approximately five volts is applied to drain lines DL1 and DL2, while ground is applied to drain line DLn. Further, a series of negative pulses are applied to the gates 134 of charge pumps CP1 and CP2, while ground is applied to gate 134 of charge pump CPn. (As noted above, the series of negative pulses can alternately be applied to all of the gates 134 of charge pumps CP1-CPn).

In operation, when gate 134 of a charge pump CP is pulsed negative, a negative potential is capacitively coupled to the surface of n-well 130 which, in turn, lowers the potential barrier across the p+ diffusion region 132 to n-well 130 junction. As a result, holes are injected into n-well 130 from p+ diffusion region 132 to form an inversion layer under gate 134, while electrons are injected into p+ diffusion region 132 from n-well 130.

The loss of holes from p+ diffusion region 132 along the increased number of electrons flowing into p+ diffusion region 132 lowers the potential on p+ diffusion region 132 which, in turn, also lowers the potential on source region 112.

The lowered potential on source region 112 lowers the potential barrier across the n+ source region 112 to p-well 116 junction. As a result, holes are injected into n+ source region 112 from p-well 116, while electrons are injected into p-well 116 from n+ source region 112.

Thus, when gate 134 is pulsed negative, holes flow from p-well 116 into n-well 130, while electrons flow from n-well 130 to p-well 116. The electrons flowing into p-well 116 are then available to participate in the formation of well or substrate hot electrons as described in Bergemont.

When the voltage on gate 134 is then pulsed back to ground (or positive), the potential at the surface of n-well 130 is raised which, in turn, raises the potential barrier across the p+ diffusion region 132 to n-well 130 junction. As a result, the holes in n-well 130 (except for the holes that are within a diffusion length of the junction depletion region) are forced to recombine with the majority carriers in n-well 130.

Thus, when a series of negative pulses are used, the above-described process is repeated for each negative pulse which, in turn, causes a charge pumped current to flow from p-well 116 into n-well 130. The charge pumped current Icp is defined by EQ. 1 as:

EQ. 1 $Icp = f*Qm$ where f is the frequency of the pulsed signal applied to gate 134 and Qm is the amount of steady-state charge in the inversion layer under gate 134.

The steady-state charge Qm in the inversion layer, in turn, is approximately given by EQ. 2 as:

EQ. 2 $Qm = Cox*Area*(Vg-Vt)$ where Cox is the gate oxide capacitance per unit area, Area is the gate area of the pump element, Vg is the gate voltage pulse amplitude, and Vt is the pump element threshold voltage.

The linear relationship between the frequency f and the charge pumped current Icp as shown in EQ. 1 exists if the frequency f is sufficiently low to allow the effective complete recombination of the steady state charge Qm to occur between pulse applications.

This linear relationship holds up to frequencies of several megahertz at room temperature. For a given amplitude of the pulsed signal, the charge pumped current Icp will increase with increasing temperature due to the well known effect of Vt (threshold voltage) reduction. In addition, the linear (in frequency) range of operation will be extended due to the enhanced recombination that occurs at elevated temperatures. Further, the desired magnitude of the forward-bias injection per pulse is achieved by appropriately sizing charge pump CP.

Figure 1:
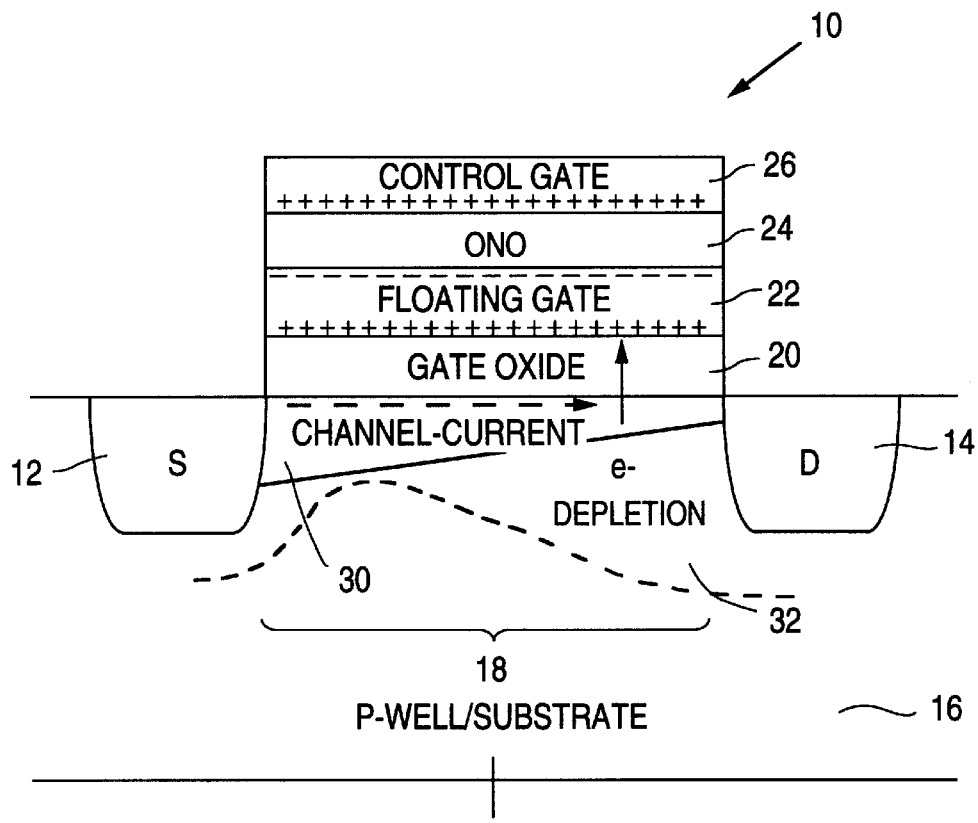
FIG. 1 is a cross-sectional diagram illustrating a conventional EPROM or flash memory cell 10.
Figure 3:
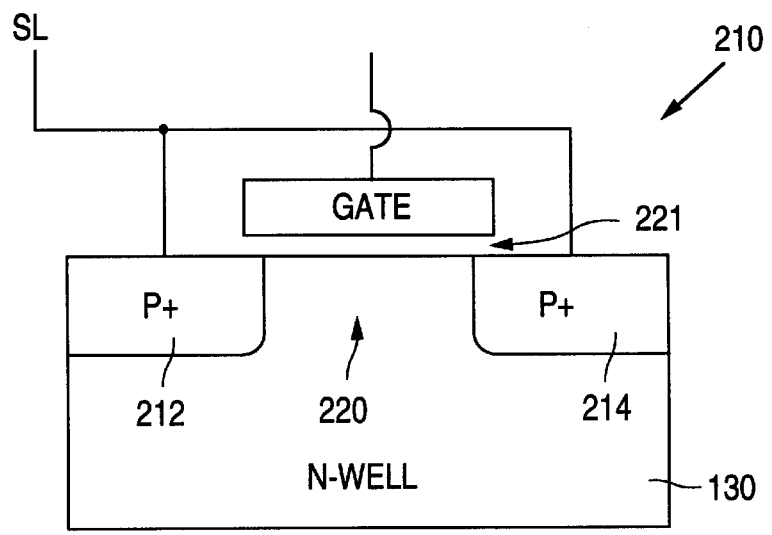
FIG. 3 is a cross-sectional view illustrating charge pump CP formed with a MOS transistor 210 in accordance with the present invention.

Alternately, rather than forming charge pump CP with a gated diode, charge pump CP can also be formed with a MOS transistor. FIG. 3 shows a cross-sectional view that illustrates charge pump CP formed with a MOS transistor 210.

As shown in FIG. 3, MOS transistor 210 includes spaced-apart p+ source and drain regions 212 and 214, respectively, which are electrically connected together, and are formed in n-well (or substrate) 116. In addition, transistor 210 also includes a channel region 220 which is defined between source and drain regions 212 and 214, a layer of insulation material 221 which is formed over channel region 220, and a gate 222 which is formed over layer 221. When charge pump CP is formed with transistor 210, charge pump CP operates as described above.

One of the advantages of the present invention is that the present invention eliminates the need to apply a negative voltage to source region 112 to forward bias the junction as the present invention obtains roughly the same result by negatively pulsing the gate of the charge pump.

It should be understood that various alternatives to the embodiment of the invention described herein may be employed in practicing the invention. Thus, it is intended that the following claims define the scope of the invention and that methods and structures within the scope of these claims and their equivalents be covered thereby.

What is claimed is:

1. A memory circuit comprising:
   a first region of semiconductor material having a first conductivity type;
   a memory cell having:
   spaced-apart source and drain regions of a second conductivity type formed in the first region of semiconductor material;
   a channel region defined between the source and drain regions;
   a layer of first insulation material formed over the channel region;
   a floating gate formed on the layer of first insulation material over the channel region;
   a layer of second insulation material formed over the floating gate; and
   a control gate formed over the layer of second insulation material;
   a second region of semiconductor material having the second conductivity type;
   a charge pump having:
   a first diffusion region of the first conductivity type formed in the second region of semiconductor material, the first diffusion region being electrically connected to the source region;
   a layer of third insulation material formed over the second region and a portion of the first diffusion region; and
   a charge pump gate formed over the layer of third insulation material.

2. The circuit of claim 1 and further including a second diffusion region of the first conductivity type formed in the second region of semiconductor material, the second diffusion region being spaced apart from the first diffusion region, electrically connected to the source region, and partially covered by the charge pump gate.

3. A method for programming a memory circuit having:
  a first region of semiconductor material having a first conductivity type;
  a memory cell having:
    spaced-apart source and drain regions of a second conductivity type formed in the first region of semiconductor material;
    a channel region defined between the source and drain regions;
    a layer of first insulation material formed over the channel region;
    a floating gate formed on the layer of first insulation material over the channel region;
    a layer of second insulation material formed over the floating gate;
    a control gate formed over the layer of second insulation material;
  a second region of semiconductor material having the second conductivity type; and
  a charge pump having:
    a diffusion region of the first conductivity type formed in the second region of semiconductor material, the diffusion region being electrically connected to the source region;
    a layer of third insulation material formed over the second region and a portion of the diffusion region; and
    a charge puma gate formed over the layer of third insulation material; and
  a control circuit connected to the control gate, the drain region, and the charge pump gate,
  the method comprising the steps of:
  identifying a threshold voltage from three or more threshold voltages which are to be set in the memory cell;
  selecting a programming voltage that corresponds to the threshold voltage, each of the three or more threshold voltages having a corresponding programming voltage;
  applying a first voltage to the first region of substrate material;
  applying a second voltage to the drain region so that a drain-to-first region junction is reverse-biased;
  applying the selected programming voltage to the control gate; and
  applying a plurality of pulses to the charge pump gate.

4. The method of claim 3 wherein the plurality of pulses are negative.

5. The method of claim 3 wherein the first voltage is applied to the second region of semiconductor material.

6. A memory circuit comprising:
  a first region of semiconductor material having a first conductivity type;
  a plurality of memory cells formed in the first region in rows and columns, each memory cell having:
    spaced-apart source and drain regions of a second conductivity type formed in the first region of semiconductor material;
    a channel region defined between the source and drain regions;
    a layer of first insulation material formed over the channel region;
    a floating gate formed over the layer of first insulation material;
    a layer of second insulation material formed over the floating gate; and
    a control gate formed over the layer of second insulation material;
  a second region of semiconductor material having the second conductivity type;
  a plurality of word lines connected to the plurality of memory cells such that each word line is connected to each control gate in a row of cells;
  a plurality of drain lines connected to the plurality of memory cells such that each drain line is connected to each drain region in a column of cells; and
  a plurality of charge pumps formed in the second region of semiconductor material, each charge pump being electrically connected to the plurality of memory cells such that each charge pump is electrically connected to each source region in a column of cells, each charge pump having:
    a first diffusion region of the first conductivity type formed in the second region of semiconductor material, the first diffusion region being electrically connected to the source region;
    a layer of third insulation material formed over the second region and a portion of the first diffusion region; and
    a charge pump gate formed over the layer of third insulation material.

7. The memory circuit of claim 6 wherein the first diffusion region of a charge pump is electrically connected to all of the source regions in a column of cells.

8. The circuit of claim 6 wherein each charge pump further includes a second diffusion region of the first conductivity type formed in the second region of semiconductor material, the second diffusion region being spaced apart from the first diffusion region, electrically connected to the first diffusion region, and partially covered by the charge pump gate.

9. A method for programming memory devices in a memory circuit comprising:
  a first region of semiconductor material having a first conductivity type;
  a plurality of memory cells formed in the first region in rows and columns, each memory cell having:
    spaced-apart source and drain regions of a second conductivity type formed in the first region of semiconductor material;
    a channel region defined between the source and drain regions;
    a layer of first insulation material formed over the channel region;
    a floating gate formed over the layer of first insulation material;
    a layer of second insulation material formed over the floating gate; and
    a control gate formed over the layer of second insulation material;
  a plurality of word lines connected to the plurality of memory cells such that each word line is connected to each control gate in a row of cells;
  a plurality of drain lines connected to the plurality of memory cells such that each drain line is connected to each drain region in a column of cells;
  a second region of semiconductor material having the second conductivity type; and
  a plurality of charge pumps formed in the second region of semiconductor material, each charge pump being electrically connected to the plurality of memory cells such that each charge pump is electrically connected to each source region in a column of cells, each charge pump having:
- a first diffusion region of the first conductivity type formed in the second region of semiconductor material, the first diffusion region being electrically connected to the source region;
- a layer of third insulation material formed over the second region and a portion of the first diffusion region; and
- a charge pump gate formed over the layer of third insulation material; and a control circuit connected to the plurality of word lines, each charge pump gate, and the plurality of drain lines;

the method comprising the steps of:
- identifying a row of cells to be programmed to identify a selected row of cells and a corresponding selected word line, and a plurality of unselected rows of cells and a corresponding plurality of unselected word lines;
- identifying one or more cells in the selected row of cells that are to be programmed to form one or more selected cells and one or more unselected cells;
- identifying a threshold voltage from three or more threshold voltages which is to be set in the one or more selected cells;
- selecting a programming voltage that corresponds to the threshold voltage, each of the three or more threshold voltages having a corresponding programming voltage;
- applying a first voltage to the first region of substrate material;
- applying a second voltage to each drain line that is connected to a cell of the one or more selected cells so that each drain-to-first region junction of the one or more selected cells is reverse-biased;
- applying the programming voltage to the selected word line; and
- applying a plurality of pulses to each charge pump gate of a charge pump that is connected to a cell of the one or more selected cells.

10. The method of claim 9 wherein ground is applied to the unselected word lines.

11. The method of claim 10 wherein ground is applied to the unselected drain lines.

12. The method of claim 11 wherein the plurality of pulses is applied to all of the charge pump gates.

* * * * *

UNITED STATES PATENT AND TRADEMARK OFFICE
CERTIFICATE OF CORRECTION

PATENT NO.: 5,978,269
DATED: November 2, 1999
INVENTOR(S): ALBERT BERGEMONT et al.

It is certified that an error appears in the above-identified patent and that said Letters Patent is hereby corrected as shown below:

In Col. 7, line 32, delete "puma" and replace with --pump--.

Signed and Sealed this

Sixth Day of June, 2000

Attest:

Q. TODD DICKINSON

Attesting Officer

Director of Patents and Trademarks